United States Patent
McManus

(10) Patent No.: US 10,992,114 B2
(45) Date of Patent: Apr. 27, 2021

(54) SYSTEMS AND METHODS FOR USING DYNAMIC MATERIALS IN NO-POWER ACTUATION OF TELECOMMUNICATIONS MAINTENANCE HARDWARE

(71) Applicant: Verizon Patent and Licensing Inc., Arlington, VA (US)

(72) Inventor: Jean M. McManus, Bernardsville, NJ (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 240 days.

(21) Appl. No.: 16/216,727

(22) Filed: Dec. 11, 2018

(65) Prior Publication Data
US 2020/0185891 A1  Jun. 11, 2020

(51) Int. Cl.
*H02B 1/28* (2006.01)
*H02B 1/56* (2006.01)
*H01R 13/453* (2006.01)
*H02G 3/08* (2006.01)

(52) U.S. Cl.
CPC ............. *H02B 1/28* (2013.01); *H01R 13/453* (2013.01); *H02B 1/565* (2013.01); *H02G 3/088* (2013.01)

(58) Field of Classification Search
CPC ........ H02B 1/28; H02B 1/565; H01R 13/453; H02G 3/088
USPC ........................................................ 361/688
See application file for complete search history.

(56) References Cited

U.S. PATENT DOCUMENTS

| | | | | |
|---|---|---|---|---|
| 4,848,653 | A * | 7/1989 | Van Becelaere | F24F 7/02 236/49.3 |
| 6,278,607 | B1 * | 8/2001 | Moore | G06F 1/203 361/679.54 |
| 8,408,981 | B2 * | 4/2013 | Su | F04D 27/002 454/358 |
| 9,261,926 | B2 * | 2/2016 | Larsen | G06F 1/20 |
| 2002/0050530 | A1 * | 5/2002 | Stefano | B60H 1/00857 236/49.3 |
| 2006/0270332 | A1 * | 11/2006 | Kober | B60H 1/34 454/69 |
| 2007/0072541 | A1 * | 3/2007 | Daniels, II | F24F 7/02 454/365 |

(Continued)

FOREIGN PATENT DOCUMENTS

| | | | | |
|---|---|---|---|---|
| DE | 202016103388 U1 * | 7/2016 | | F24F 13/06 |
| EP | 1731700 A2 * | 12/2006 | | E05F 15/60 |

OTHER PUBLICATIONS

M. Young, "4D Printing—All You Need to Know in 2018," All3DP, Feb. 22, 2018 (available at https://all3dp.com/1/4d-printing, visited Oct. 8, 2018).

(Continued)

*Primary Examiner* — Anatoly Vortman

(57) ABSTRACT

A system described herein may allow for the actuating of venting apparatuses, without needing to supply electrical power. For example, a self-actuating material may be used, which may be responsive to heat, to open and/or close the venting apparatus. When the temperature of an apparatus, to which the venting apparatus is affixed, exceeds a threshold temperature, the venting apparatus may open. On the other hand, when the temperature of an apparatus, to which the venting apparatus is affixed, exceeds a threshold temperature, the venting apparatus may close.

20 Claims, 16 Drawing Sheets

(56) References Cited

U.S. PATENT DOCUMENTS

| | | | | |
|---|---|---|---|---|
| 2007/0184238 | A1* | 8/2007 | Hockaday | B32B 7/02 428/98 |
| 2008/0272615 | A1* | 11/2008 | McKnight | F15D 1/10 296/180.5 |
| 2009/0061188 | A1* | 3/2009 | Browne | B32B 7/05 428/217 |
| 2010/0112924 | A1* | 5/2010 | Alexander | F16K 31/025 454/70 |
| 2010/0330894 | A1* | 12/2010 | Alexander | B60H 1/249 454/70 |
| 2013/0037252 | A1* | 2/2013 | Major | B60H 1/00842 165/202 |
| 2015/0003008 | A1* | 1/2015 | Larsen | G06F 1/206 361/679.46 |
| 2018/0175785 | A1* | 6/2018 | Rakow | H02S 30/20 |
| 2019/0331355 | A1* | 10/2019 | Daniels, II | F24F 7/02 |

OTHER PUBLICATIONS

M. Crawford, "'4D' Printing: The Next Level of Additive Manufacturing," ASME, Apr. 2014 (available at https://www.asme.org/engineering-topics/articles/manufacturing-processing/4d-printing-next-level-additive-manufacturing, visited Oct. 12, 2018).

J. Thomas et al., "Going Beyond 3D Printing to Add a New Dimension for Additive Manufacturing," NLawrence Livermore National Laboratory, Aug. 23, 2016 (available at https://www.llnl.gov/news/going-beyond-3d-printing-add-new-dimension-additive-manufacturing, visited Oct. 12, 2018).

Wikipedia, "Shape-Memory Polymer," (available at https://en.wikipedia.org/wiki/Shape-memory_polymer, visited Nov. 18, 2018).

* cited by examiner

SYSTEMS AND METHODS FOR USING DYNAMIC MATERIALS IN NO-POWER ACTUATION OF TELECOMMUNICATIONS MAINTENANCE HARDWARE

BACKGROUND

Equipment (e.g., telecommunications equipment, power delivery equipment, etc.) that is installed outdoors is often subject to harsh conditions, such as excessive heat or cold, moisture, and pests (e.g., insects, vermin, rodents, etc.). One potential option to address these conditions is to place vents, holes, outlets, and/or other constructs that allow airflow and/or moisture drainage. However, solving one problem may introduce others. For instance, adding vents or holes to allow heat to escape the equipment may allow moisture or pests to enter the equipment. Another approach, which entails using motorized flaps or other electronics, may solve the above issues but may necessitate the need for a power source (and potentially costly or difficult to maintain electrical components) to actuate the motorized flaps and/or other electronics.

DETAILED DESCRIPTION OF THE PREFERRED EMBODIMENTS

The following detailed description refers to the accompanying drawings. The same reference numbers in different drawings may identify the same or similar elements.

Some embodiments, described herein, may provide for the use of self-actuating materials to provide venting functionality for outdoor equipment. As discussed herein, the term "self-actuating material" may refer to a material (or composition of materials) that is capable of achieving two or more shape states. A "shape state" refers to a shape, or arrangement, of a given self-actuating material. For example, a given self-actuating material may maintain one shape state (e.g., may be closed) at a first temperature, and may maintain another shape state (e.g., may be open) when exposed to a higher temperature. Further, the self-actuating material may return to the first shape state when exposed to the first temperature.

Some self-actuating materials, in accordance with some embodiments, may be (or may include) so-called "4D printed" materials. A "4D printed" material may be a material that is capable of being synthesized, or "printed" using a specialized device such as a device sometimes referred to as a "3D printer" or a "4D printer." As discussed herein, a "4D printed" material may be a material that is designed and printed in three dimensions (e.g., has one or more defined heights, widths, and depths), and also reacts to external stimuli in order to change shape from one shape state to another. Examples of such external stimuli may include heat (or cold), moisture (or lack thereof), or electrical current (or lack thereof). These materials may be made from reagents such as soybean oil-based materials, co-polymers, carbon nanofibers, and/or other types of suitable reagents. In some embodiments, a 4D printed material may be, or may include, a shape-memory polymer (e.g., a thermally induced shape-memory polymer).

As discussed herein, self-actuating materials (such as 4D printed materials) are "self-actuating" in that no external materials, mechanisms, devices, motors, or the like are needed to actuate (e.g., change the shape state of) such self-actuating materials. Instead, as mentioned above, the self-actuating materials are capable of changing their shape states in response to stimuli, such as heat, cold, moisture, dryness, etc. For example, a self-actuating material that is responsive to heat may transition from one shape state to a second shape state when exposed to heat (e.g., above a threshold temperature), may maintain the second shape state while still exposed to the heat, and may return to the initial shape state when no longer exposed to the heat.

Figure 1A:
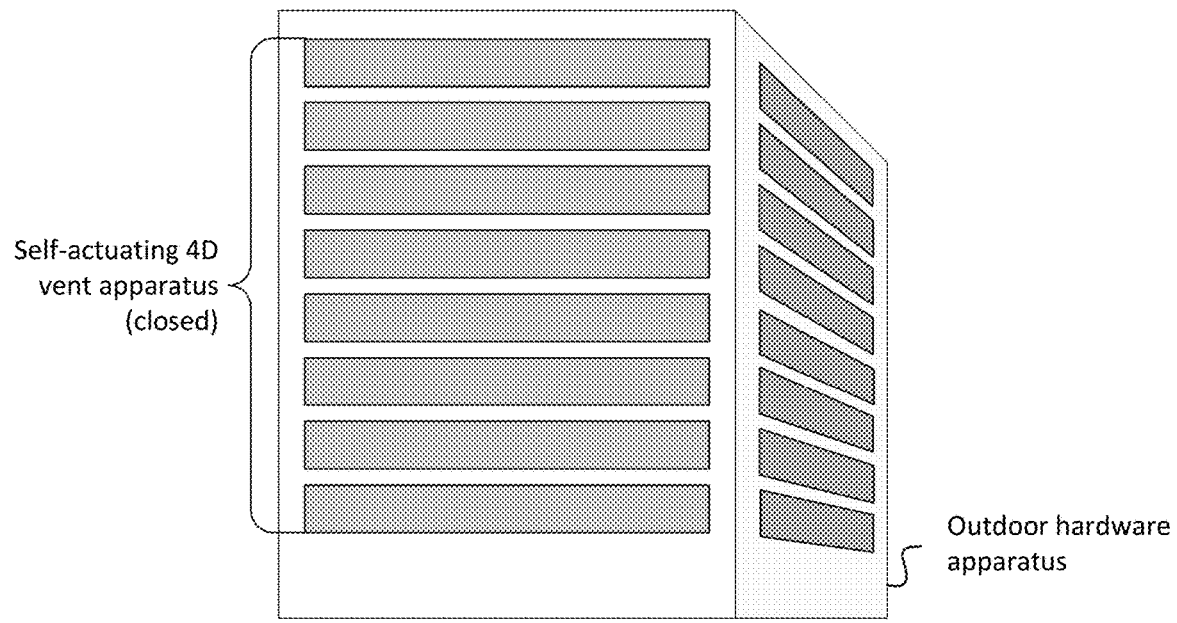
FIG. 1A illustrates an example of an outdoor apparatus with closed self-actuating venting apparatus, in accordance with some embodiments.

Some embodiments described herein may be applicable to outdoor hardware apparatuses, such as telecommunications Optical Network Terminal ("ONT") boxes, power delivery transformers, outdoor camera systems, kiosks, etc. (e.g., devices that are installed outdoors, and/or are otherwise exposed to outdoor elements). For example, as shown in FIG. 1A, an outdoor hardware apparatus may include a self-actuating 4D vent apparatus. In this example, the self-actuating 4D vent apparatus may be constructed either entirely or in part from a 4D printed material that curves based in response to one or more stimuli (e.g., heat, moisture, etc.). The self-actuating 4D vent apparatus may, in this example, include a set of flaps that are attached to vent holes that are cut out of the outdoor hardware apparatus. Thus, when the self-actuating 4D vent apparatus is closed (e.g., as shown in FIG. 1A), the hardware apparatus may be sealed, and therefore protected from moisture (e.g., from rain), pests, and other factors that may negatively affect the hardware apparatus.

Figure 1B:
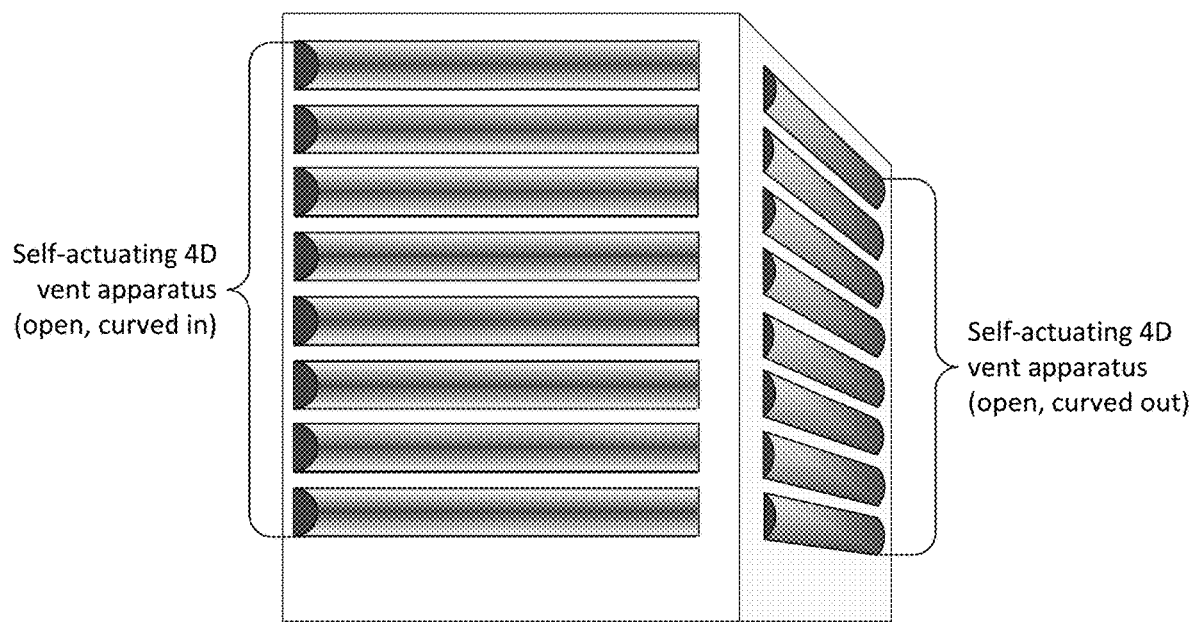
FIG. 1B illustrates an example of an outdoor apparatus with opened self-actuating venting apparatus, in accordance with some embodiments.

FIG. 1B illustrates the outdoor hardware apparatus of FIG. 1A, with the self-actuating 4D vent apparatus being opened to allow venting. As shown, the 4D printed material may curve in response to a stimulus, such as heat that exceeds a threshold temperature. In some embodiments, the 4D printed material may curve inward (e.g., in to the vent holes of the outdoor hardware apparatus), while in some embodiments, the 4D printed material may curve outward (e.g., away from the vent holes of the outdoor hardware apparatus). In the example shown in FIG. 1B, the 4D printed material on one face may curve inwards when actuated (e.g., when responding to a stimulus, such as a temperature that exceeds a threshold temperature), while the 4D printed material on another face may curve outwards when actuated.

Figure 2A:
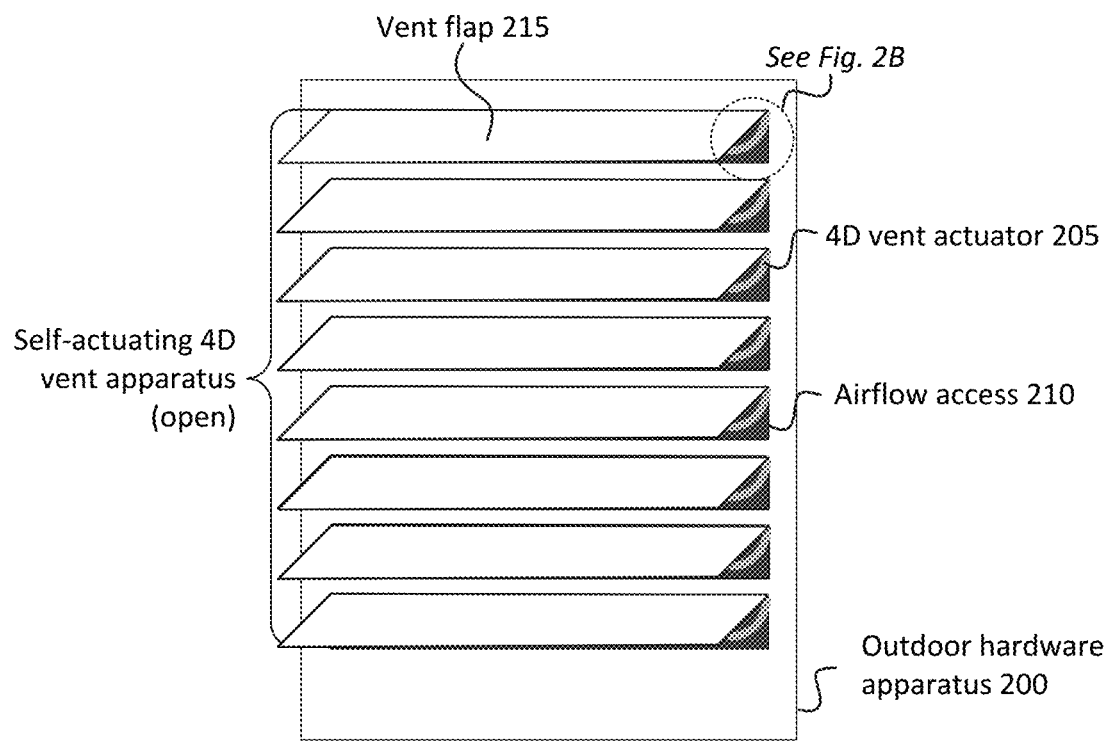
FIGS. 2A and 2B illustrate an example embodiment, in which curved self-actuating materials may be used to actuate vent flaps of an outdoor apparatus.

In some embodiments, 4D printed material may be used as an actuator for a vent flap, where the vent flap itself may or may not include any 4D printed material. For example, as shown in FIG. 2A, outdoor hardware apparatus 200 may include airflow access 210, as well as a self-actuating 4D vent apparatus that can open or close to expose or cover airflow access 210. Generally speaking, airflow access 210 may include a cutout, vent, hole, membrane, and/or other type of feature in the surface of outdoor hardware apparatus 200 that allows air to pass between the outside of outdoor hardware apparatus 200 and the inside of outdoor hardware apparatus 200. The passing of air (e.g., ventilation) may allow components with in outdoor hardware apparatus 200, such as heat-sensitive electronic components, to receive ventilation to ensure the longevity and proper operation of the electronic components. Furthermore, since the vent apparatus is self-actuating, it would not be necessary to provide power (e.g., electrical power) to the vent apparatus, thus saving the complexity of needing to design and implement a power delivery system and the subsequent maintenance thereof.

As shown, the self-actuating 4D vent apparatus may include 4D vent actuators 205 and vent flaps 215. Generally speaking, 4D vent actuators 205 may be constructed out of, and/or may include, 4D printed materials that change shape in response to stimuli, such as heat. The specific 4D material(s) used for 4D actuator 205 may be selected based on how the individual material (or materials) respond to a given stimulus, such as heat. For instance, in applications where it is desired for 4D actuator 205 to actuate (e.g., curve) at 50 degrees Celsius, a 4D material (or composition of multiple 4D materials) may be selected that reacts (e.g., changes shape) at 50 degrees Celsius. Vent flap 215 may be constructed out of, and/or may include, any suitable material that is able to actuated by, and affixed to (and/or may freely rest on) 4D actuator 205. For example, flap 215 may be, or may include, metal, metallic alloy, a non-metallic material (e.g., plastic, polymer, etc.).

Figure 2B:
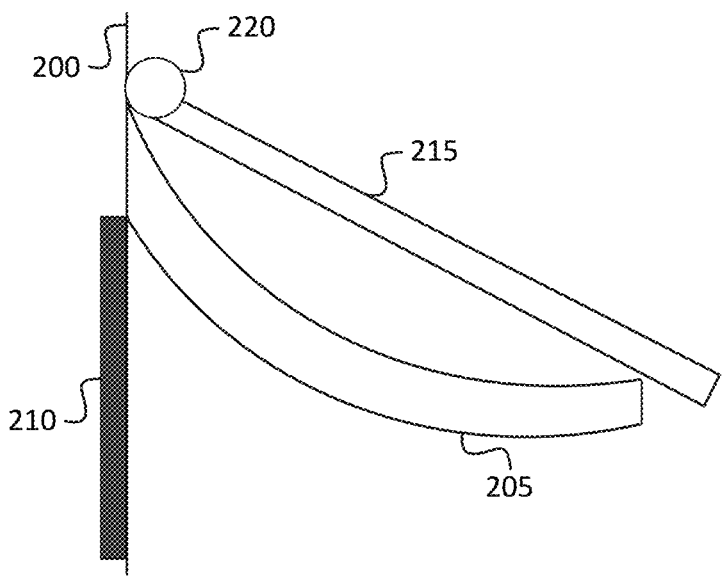

FIG. 2B shows a side view of a portion of the self-actuating 4D vent apparatus shown in FIG. 2A. As shown, airflow access 210 may be exposed when 4D actuator 205 is actuated (e.g., curved open, as shown in this figure). The curvature of 4D actuator 205, shown in FIG. 2B, may occur as the result of a stimulus, such as an ambient temperature surrounding 4D actuator 205 exceeding a threshold temperature. 4D actuator 205 may include a 4D printed material, and/or a composition of materials that includes one or more 4D printed materials, that curve away from airflow access 210 when exposed to excessive heat (e.g., when the ambient temperature surrounding 4D actuator 205 exceeds the threshold temperature), and also are rigid and/or strong enough to support the weight of vent flap 215 when curved away from airflow access 210. Generally speaking, 4D actuator 205 may curve when the components within outdoor hardware apparatus 200 overheat, and the curvature of 4D actuator 205 (and the resulting exposure of airflow access 210 by way of vent flap 215 being removed from airflow access 210) may allow the components within outdoor hardware apparatus 200 to receive ventilation.

In some embodiments, 4D actuator 205 may be affixed to a surface of outdoor hardware apparatus 200 with one or more fasteners, such as screws, nuts, bolts, etc. In some embodiments, 4D actuator 205 may be bonded to a surface of outdoor hardware apparatus 200 with glue, epoxy, and/or may itself have adhesive properties. Hinge 220 may be affixed or bonded to outdoor hardware apparatus 200 using any suitable technique, and may also be affixed or bonded to vent flap 215. In some embodiments, hinge 220 may include a pin, or similar type of element, that rotates to assist the opening and closing of vent flap 215. Hinge 220 may serve to provide structural stability and also facilitate the opening and closing of vent flap 215 as a result of the actuation (e.g., curving in response to a stimulus, or straightening in absence of the stimulus) of 4D actuator 205.

Figure 3:
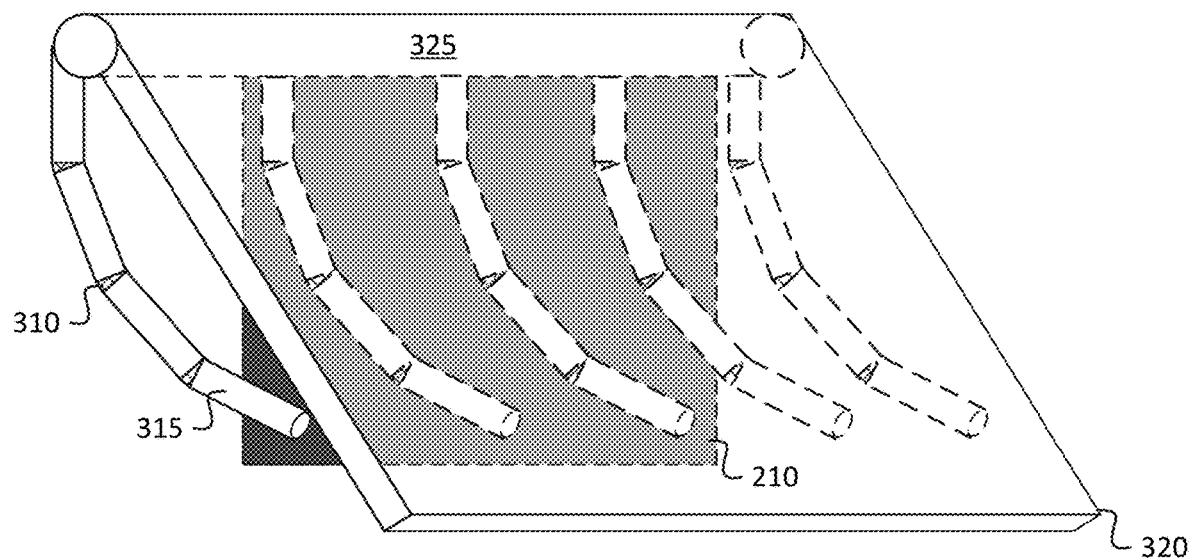
FIG. 3 illustrates an example embodiment, in which self-actuating materials may be used in combination with other types of materials in order to form actuating arms for a vent flap.

FIG. 3 illustrates an oblique view of an example embodiment in which actuating arms 315 are attached to 4D hinges 310. When exposed to stimuli, such as heat, 4D hinges 310 may contract and/or bend in the manner shown in FIG. 3, thus causing vent flap 320 to move from a position that is substantially flush and/or substantially parallel to airflow access 210 (e.g., a "closed" position) to a position whereby airflow access 210 is exposed (e.g., an "open" position). In some embodiments, actuator arms 315 may be made of materials that do not include 4D printed materials. In some embodiments, hinge 325 may, similar to hinge 220, serve to facilitate the opening and closing of vent flap 320.

Figure 4A:
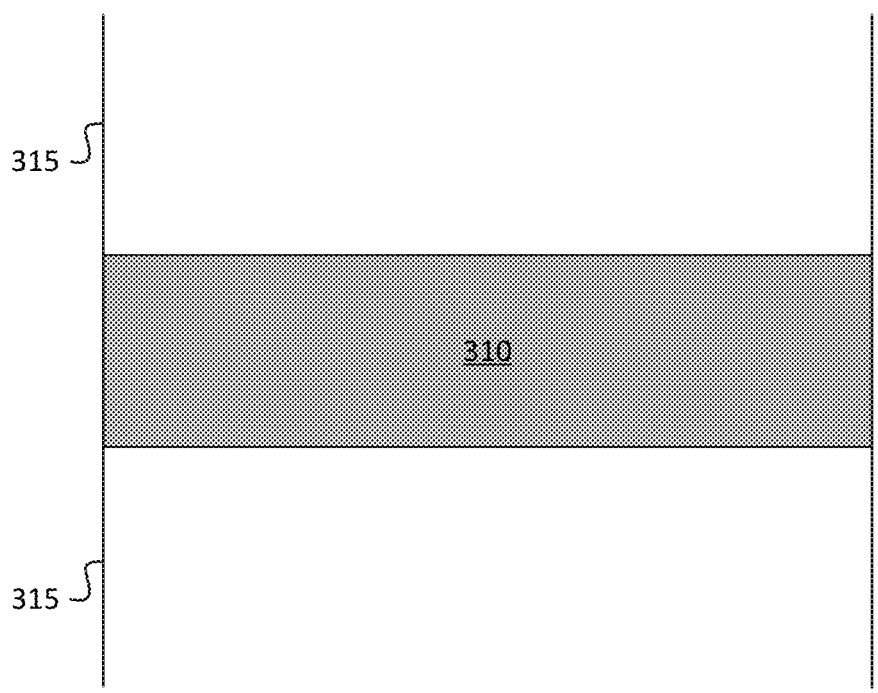
FIGS. 4A and 4B illustrate a side view of a self-actuating arm shown in FIG. 3.

FIG. 4A shows a side view of a particular 4D hinge 310, which is attached to two actuator arms 315. In this figure, 4D hinge 310 may be in an "un-actuated" state. For example, if 4D hinge 310 actuates when exposed to temperatures 50 degrees Celsius and above, 4D hinge 310 may be in the state shown in FIG. 4A when not exposed to temperatures 50 degrees Celsius and above (e.g., cooler than 50 degrees Celsius). In FIG. 4A, the "un-actuated" state of 4D hinge 310 may cause actuator arms 315 to remain in a substantially "straight" or parallel configuration, such that actuator arms 315 may be considered "un-actuated" or "closed." While not shown here, a vent flap (e.g., vent flap 320) may rest against and/or may be suitably fastened to actuator arms 315 and/or may otherwise be oriented, when closed, to close or seal airflow access 210.

Figure 4B:
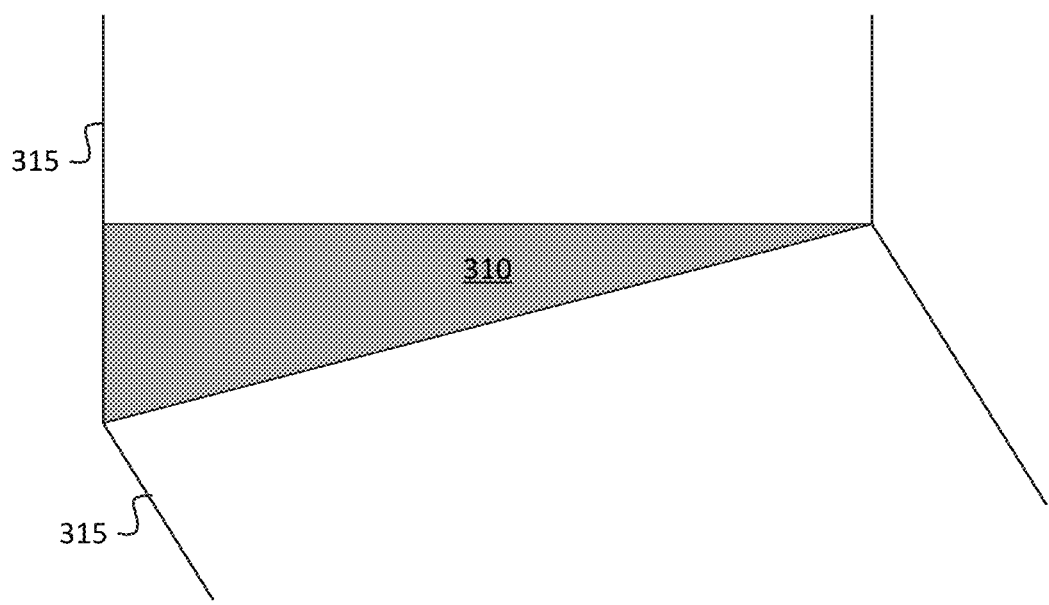

FIG. 4B shows a side view of a particular 4D hinge 310 which is attached to two actuator arms 315, where 4D hinge 310 is in an "actuated" state. For example, if 4D hinge 310 actuates when exposed to temperatures 50 degrees Celsius and above, 4D hinge 310 may be in the state shown in FIG. 4B when exposed to temperatures 50 degrees Celsius and above (e.g., warmer than 50 degrees Celsius). In FIG. 4B, the "actuated" state of 4D hinge 310 may cause actuator arms 315 to enter an "angled" configuration, such that actuator arms 315 may be considered "actuated" or "open." While not shown here, a vent flap (e.g., vent flap 320) may rest against actuator arms 315 and/or may otherwise be oriented, when opened, to expose (either fully or partially) airflow access 210.

Figure 5:
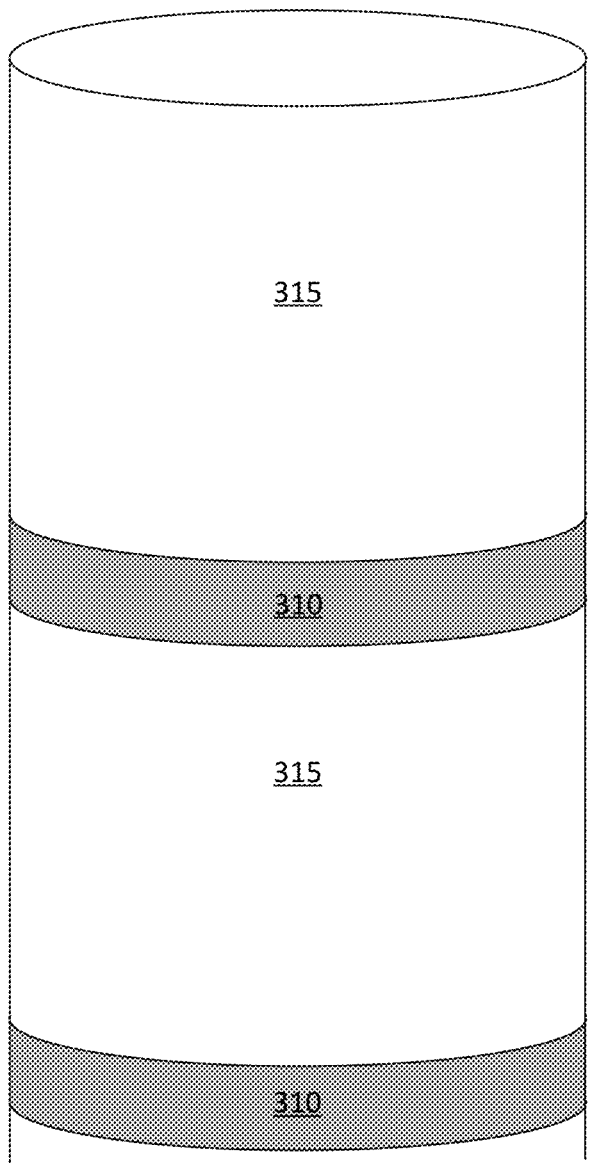
FIG. 5 illustrates an oblique view of the self-actuating arm shown in FIGS. 4A and 4B.

FIG. 5 illustrates an oblique view of multiple 4D hinges 310 and actuator arms 315. In this example, actuator arms 315 may be substantially cylindrical, and 4D hinges 310 may be oriented in between actuator arms 315 as disks. While a cylindrical shape is shown in FIG. 5, in practice, different shapes can be used without departing from the concepts described herein (e.g., triangular prisms, rectangular prisms, irregular polygons, and/or other suitable shapes).

Figure 6A:
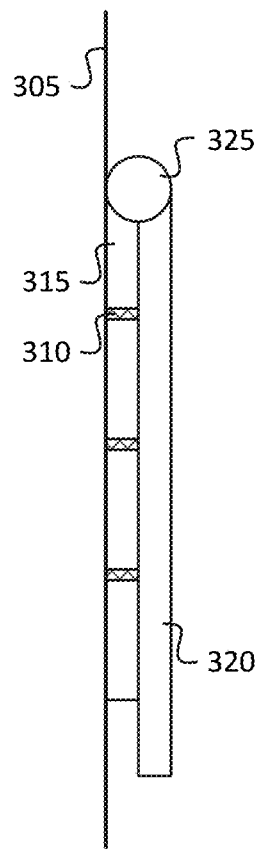
FIGS. 6A-6D illustrate a side view of the operation of one or more self-actuating arms, in accordance with some embodiments.
Figure 6B:
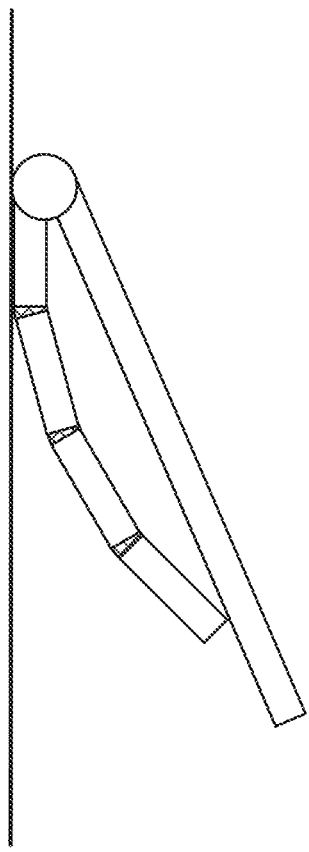
Figure 6C:
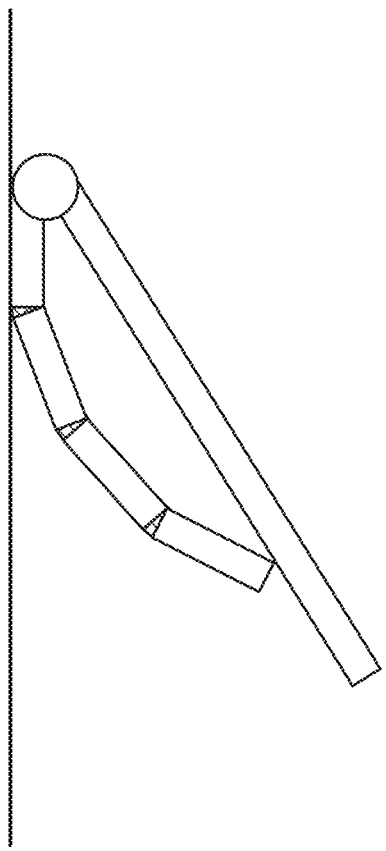

FIGS. 6A-6C illustrate an actuation of a 4D venting apparatus, attached to surface 305, that includes some or all of the components shown in, for example, FIGS. 3-5. Generally speaking, surface 305 may correspond to an outer face of an outdoor hardware apparatus, such as telecommunications equipment. In FIG. 6A, the venting apparatus may be considered "closed," as vent flap 320 is oriented substantially parallel to surface 305. While not shown here, a vent, hole, etc. may be located "behind" vent flap 320 (e.g., on the left side of the figure), such that the closed venting apparatus may be closing, sealing, and/or otherwise restricting access to the vent. It may be advantageous to block access to the vent when venting is not necessary (e.g., when the temperature is below a threshold temperature, which may indicate that components within the hardware apparatus may not be overheating), as restricting airflow access may also result in restricting the ability for moisture (e.g., rain), pests (e.g., rodents, insects, etc.), vandals, or other environmental concerns (e.g., dirt, mud, or the like) from entering the apparatus. In the "closed" configuration shown in this figure, 4D hinges 310 may be in an "un-actuated" state.

FIGS. 6B and 6C illustrate various stages of the actuation process. For example, 4D hinges 310 may be designed to open to the degree shown in FIG. 6C, and the view shown in FIG. 6B may be an intermediate view of 4D hinges 310 transitioning from an "un-actuated" state (e.g., as shown in FIG. 6A) to an "actuated" state (e.g., as shown in FIG. 6C).

In some embodiments, vent flap 320 and actuator arm 315 may both be affixed to hinge 325. In some embodiments, vent flap 320 and actuator arm 315 may not be otherwise attached or affixed to each other. For instance, as shown in FIGS. 6A-6C, vent flap 320 may make contact with actuator arm 315 as actuator arm 315 actuates (e.g., may rest freely on actuator arm 315), but may not otherwise be affixed, bonded, or fastened to actuator arm 315.

Figure 6D:
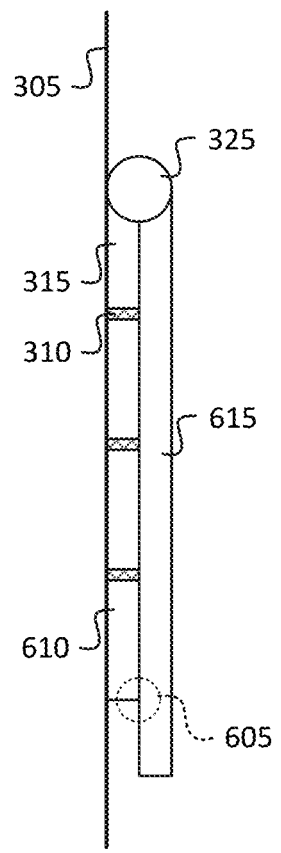

In some embodiments, vent flap 320 and actuator arm 315 may be attached or affixed to each other, in addition to being affixed to hinge 325. For instance, as shown in FIG. 6D, one or more mechanisms, devices, etc. may be used at junction 605, between actuator arm 610 and vent flap 615. For example, actuator arm 610 and/or vent flap 615 may include a suitable sliding mechanism, which may include one or more of a bearing, a wheel, a slide, a catch, a channel, and/or some other suitable mechanism that mates actuator arm 610 to vent flap 615 while allowing actuator arm 610 to contact vent flap 615 at different points, depending on whether actuator arm 610 is actuated (e.g., open), not actuated (e.g., closed), or at some position in between.

In some embodiments, the 4D materials (or compositions of materials) used for 4D hinges 310 may feature multiple actuation thresholds. For example, 4D hinges 310 may actuate a first amount (e.g., to become partially open, as shown in FIG. 6B) when reaching a first threshold temperature (e.g., 50 degrees Celsius), and then to actuate a second amount (e.g., to become fully open, as shown in FIG. 6C) when reaching a second threshold temperature (e.g., 60 degrees Celsius). For example, in some embodiments, a single 4D material may exhibit qualities that allow for multiple temperature thresholds for actuation. In some embodiments, 4D hinge 310 may include two or more distinct 4D materials, where one of the 4D materials has a first actuation threshold, and another one of the 4D materials has a second actuation threshold (e.g., where an "actuation threshold" may refer to, for instance, a temperature above or below which the 4D material actuates or changes shape). In some such embodiments, FIG. 6A may reflect that none of the actuation thresholds have been met, FIG. 6B may reflect that at least one actuation threshold has been met but at least one other actuation threshold has not been met, and FIG. 6C may reflect that all applicable actuation thresholds have been met. In this sense, the amount of actuation can vary based on how much heat is being experienced by 4D hinges 310.

In some situations, it may be preferable for a 4D venting apparatus to forgo actuating, even when the actuation stimulus is present. For example, it may be preferable for some electronic components, housed within an outdoor hardware apparatus, to experience excess heat instead of being exposed to moisture. For instance, when rain is falling on an outdoor hardware apparatus, it may be preferable for the electronic components to experience excess heat rather than using 4D venting apparatus to potentially expose the electronic components to the rain.

Figure 7:
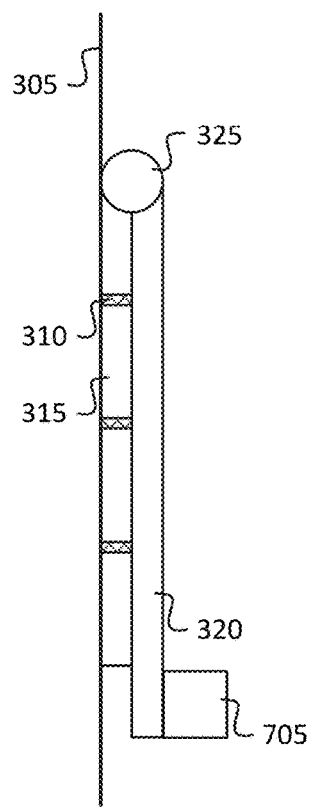
FIG. 7 illustrates a side view of a self-actuating venting apparatus, in accordance with some embodiments, in which a moisture retention apparatus is used to prevent the actuation of the vent when the moisture apparatus is full.
Figure 8A:
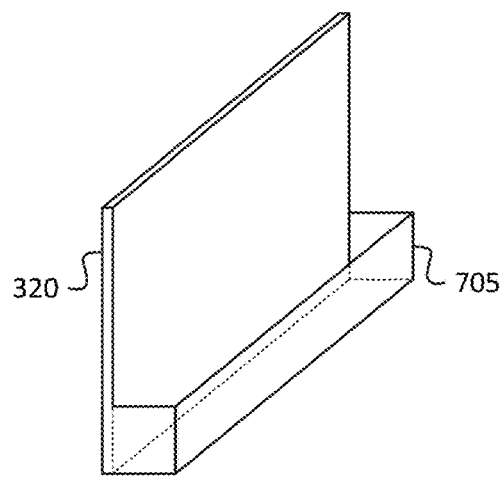
FIGS. 8A and 8B illustrate oblique views of a vent flap and moisture retention apparatus, in accordance with some embodiments.
Figure 8B:
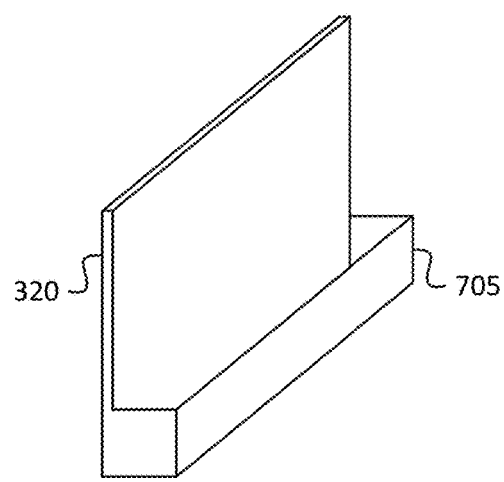

FIG. 7 illustrates a side view of a 4D venting apparatus, in accordance with some embodiments, in which trough 705 is placed on (e.g., fastened to, fused to, and/or otherwise attached) vent flap 320. FIGS. 8A and 8B illustrate oblique views that show trough 705 running along the length of vent flap 320. When rain is falling, trough 705 may fill with rainwater, thus effectively weighing down vent flap 320, and increasing the force necessary for 4D hinges 310 to actuate actuator arms 315. However, 4D hinges 310 may not actuate (e.g., when excessive heat is present) with enough force to overcome the additional weight of the water filling trough 705, and vent flap 320 may remain in a "closed" state.

To this end, the 4D material (and/or composition of materials) for 4D hinges 310 may be selected such that the weight of liquid (e.g., water) in trough 705 may be too heavy for 4D hinges 310 to actuate. However, when trough 705 is not full (and/or is not holding an amount of water that would be to heavy for 4D hinges 310 to actuate, such as after rainwater evaporates from trough 705), 4D hinges 310 may operate "normally" (e.g., respond to stimuli, such as heat, without being impeded by the extra weight of fluid in trough 705).

Figure 9A:
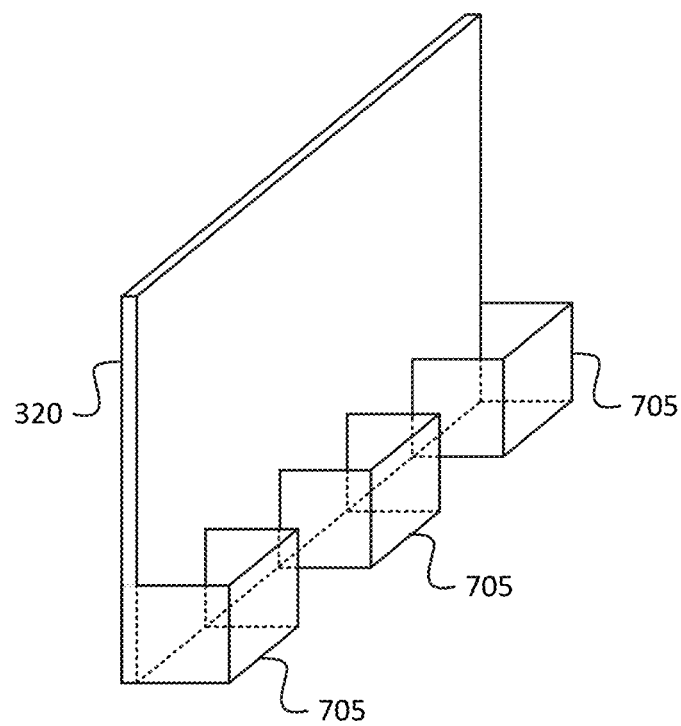
FIGS. 9A and 9B illustrate oblique views of a vent flap, which includes multiple moisture retention apparatuses, in accordance with some embodiments.
Figure 9B:
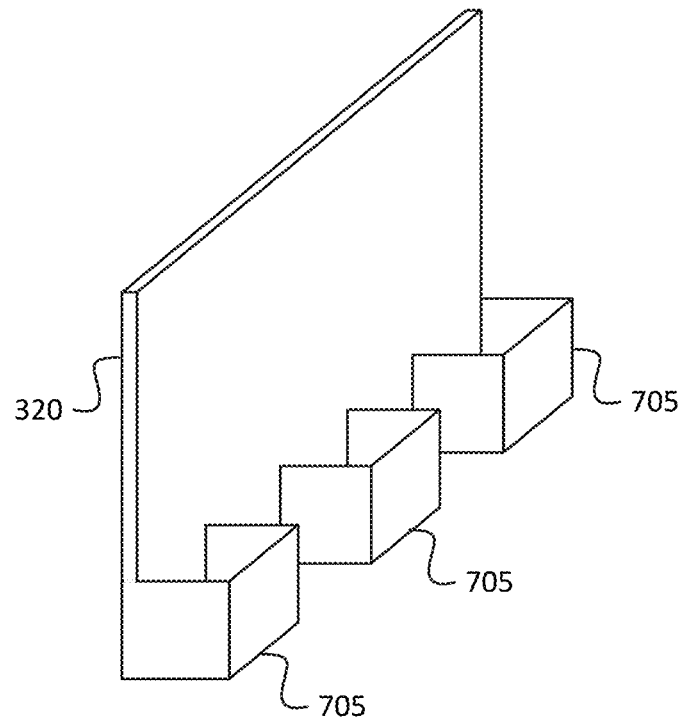

FIGS. 9A and 9B illustrate oblique views of embodiments in which multiple troughs 705 are placed on vent flap 320. Multiple troughs 905 may be used in situations where a single longer trough 705 (e.g., as shown in FIGS. 8A and 8B) may be too heavy, and/or when it may desirable for the 4D venting apparatus to open under wetter conditions than allowed for in FIGS. 8A and 8B. For example, since the three troughs 905 shown in FIGS. 9A and 9B may cumulatively hold less water than a single trough 705 that would span the length of vent flap 320 (e.g., as shown in FIGS. 8A and 8B), it may take longer for troughs 905 to accumulate the same amount of rainwater as it would take for trough 705 to accumulate.

The foregoing description of implementations provides illustration and description, but is not intended to be exhaustive or to limit the possible implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

Figure 10:
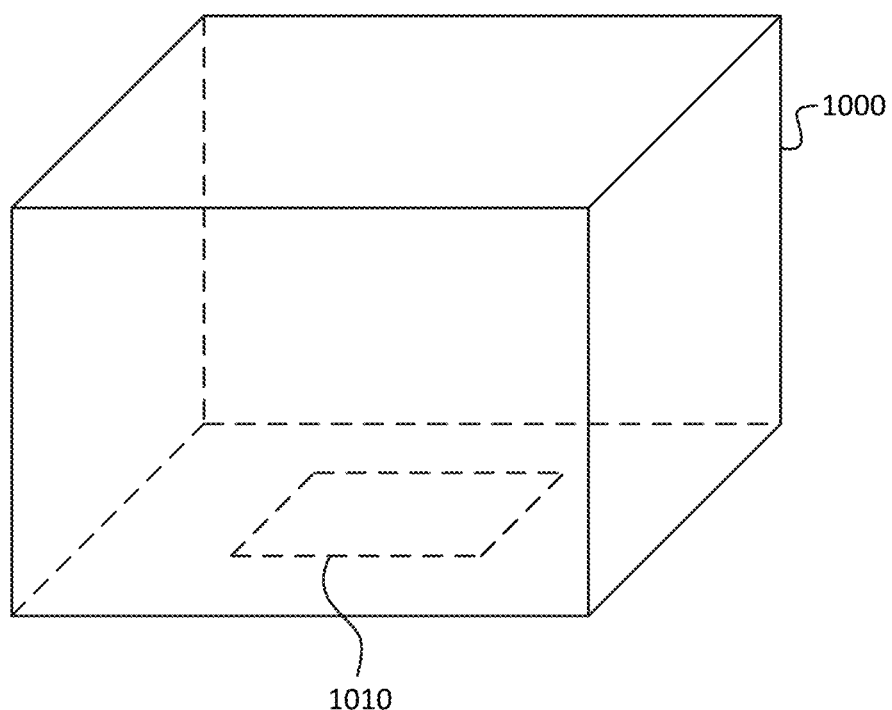
FIG. 10 illustrates an oblique view of an outdoor hardware apparatus with a self-actuating vent apparatus on a bottom surface.

For example, while self-actuating venting apparatuses were described above in the context of being on a substantially vertical face of an outdoor hardware apparatus, some embodiments may provide for self-actuating venting apparatuses on one or more other faces, in addition to or in lieu of vertical faces. For example, as shown in FIG. 10, outdoor hardware apparatus 1000 may include self-actuating vent apparatus 1010. In some embodiments, self-actuating venting apparatus may be of a similar structure as described above with respect to FIGS. 1A and 1B (e.g., may include a 4D material that curves inward or outward, such that venting is exposed), FIGS. 2A and 2B (e.g., one or more vent flaps that are actuated entirely by a 4D material), FIGS. 3-6D (e.g., one or more vent flaps that are actuated by a combination of 4D material and potentially other types of materials), and/or other suitable types of self-actuating venting apparatuses.

Figure 11A:
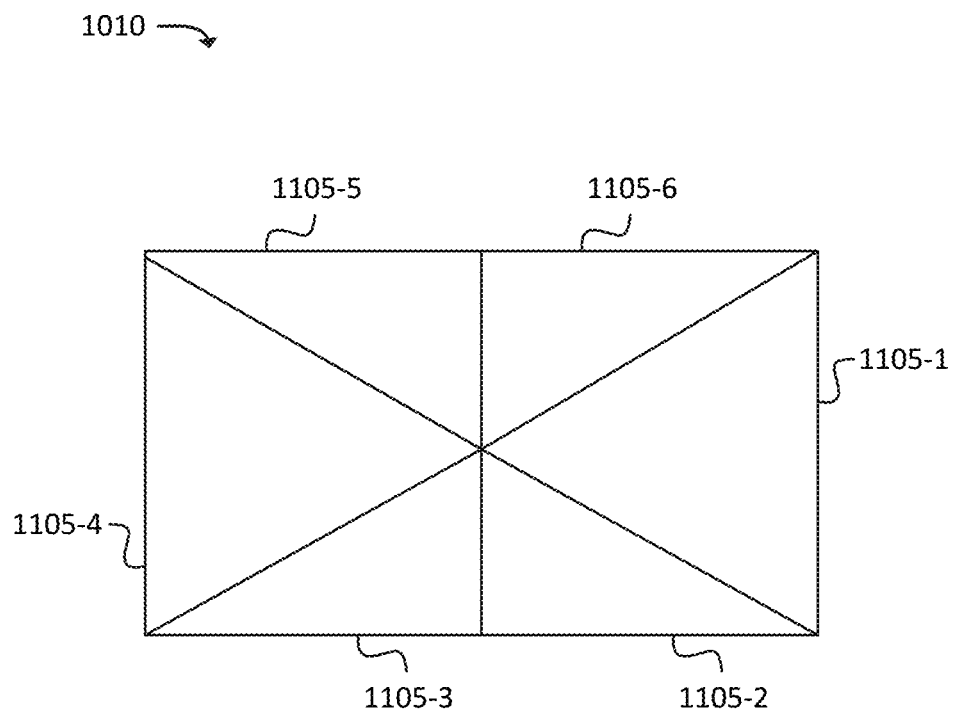
FIGS. 11A and 11B illustrate two-dimensional views of a self-actuating vent apparatus, in accordance with some embodiments.
Figure 11B:
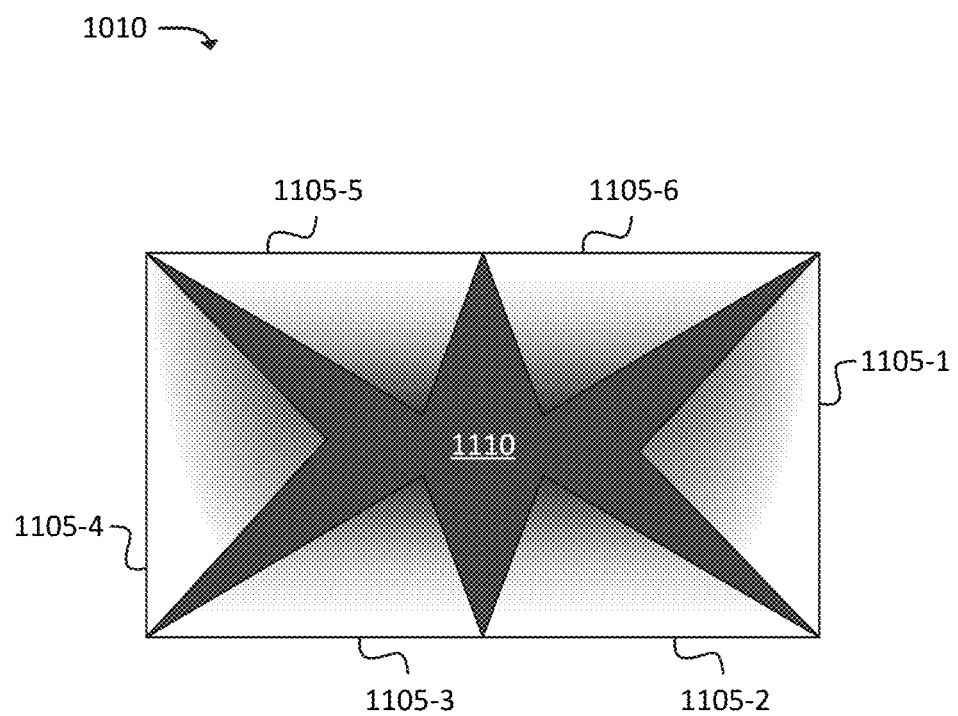
Figure 12:
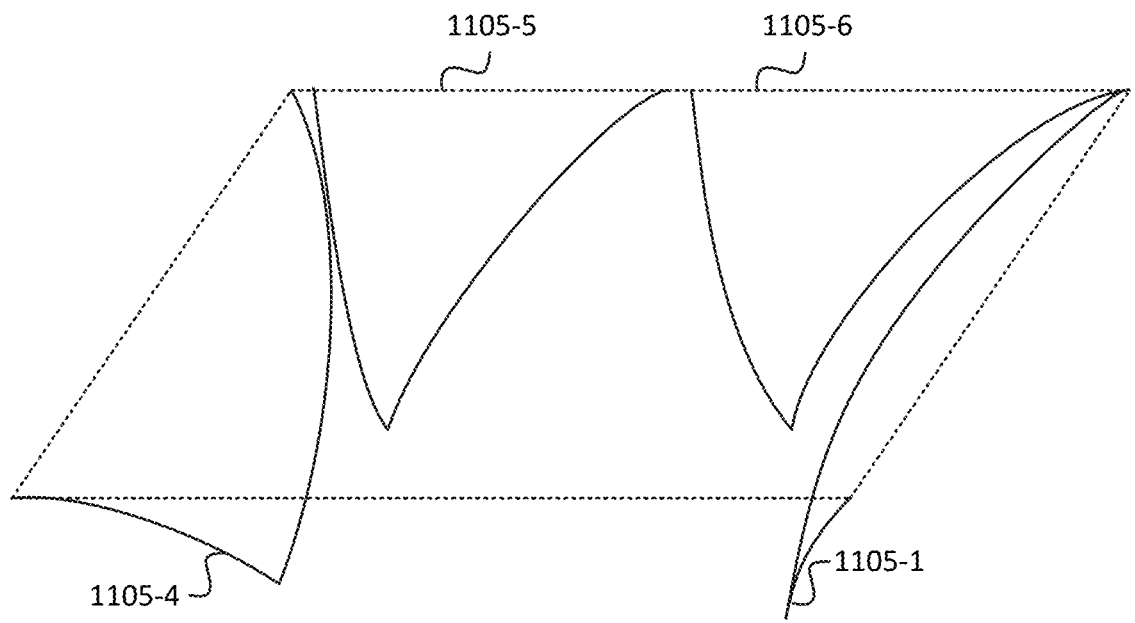
FIG. 12 illustrates an oblique view of a self-actuating vent apparatus, in accordance with some embodiments.

FIGS. 11A-12 illustrate an example self-actuating apparatus 1010, in accordance with some embodiments. For example, as shown in FIG. 11A, self-actuating apparatus 1010 may include multiple panels 1105. Six panels 1105-1 through 1105-6 are shown in this figure; in practice, different quantities of panels may be used (e.g., 4 panels, 20 panels, etc.). Panels 1105 may be constructed out of, either partially or entirely, self-actuating materials. The self-actuating materials used for panels 1105 may, in some embodiments, be reactive to moisture. For example, when exposed to moisture, panels 1105 may change shape to transition from a first shape state (e.g., a shape state in which panels 1105 come together to form a contiguous, or substantially contiguous, surface), as shown in FIG. 11A, to a second shape state (e.g., a shape state in which one or more of panels 1105 are separated from the other panels 1105), as shown in FIG. 11B. In other words, self-actuating apparatus 1010 may be considered "closed" in FIG. 11A, and "open" in FIG. 11B.

As shown in FIG. 11B, panels 1105 may be in an actuated state in response to a stimulus, such as moisture. In the actuated state, panels 1105 may change shape such that panels 1105 are separate from each other, but are still affixed, fastened, fused, etc. to a surface of an object (e.g., to outdoor hardware apparatus 1000). Due to the changing of the shape of panels 1105, opening 1110 may be exposed (e.g., in the bottom of outdoor hardware apparatus 1000). In embodiments where panels 1105 are reactive to moisture, the opening of panels 1105 may allow for moisture to drain out of opening 1110. Further, once moisture is no longer present, panels 1105 may return to their original shape state, and re-seal opening 1110.

FIG. 12 illustrates an oblique view of four of the six open panels shown in FIG. 11B (i.e., panels 1105-2 and 1105-3 are not shown here, for clarity of illustration). As shown, panels 1105 may achieve the "open" shape state by curving outward (e.g., away from the interior of outdoor hardware apparatus 1000). In some embodiments, panels 1105 may achieve the "open" shape state by curving inward (e.g., toward the interior of outdoor hardware apparatus 1000).

Figure 13:
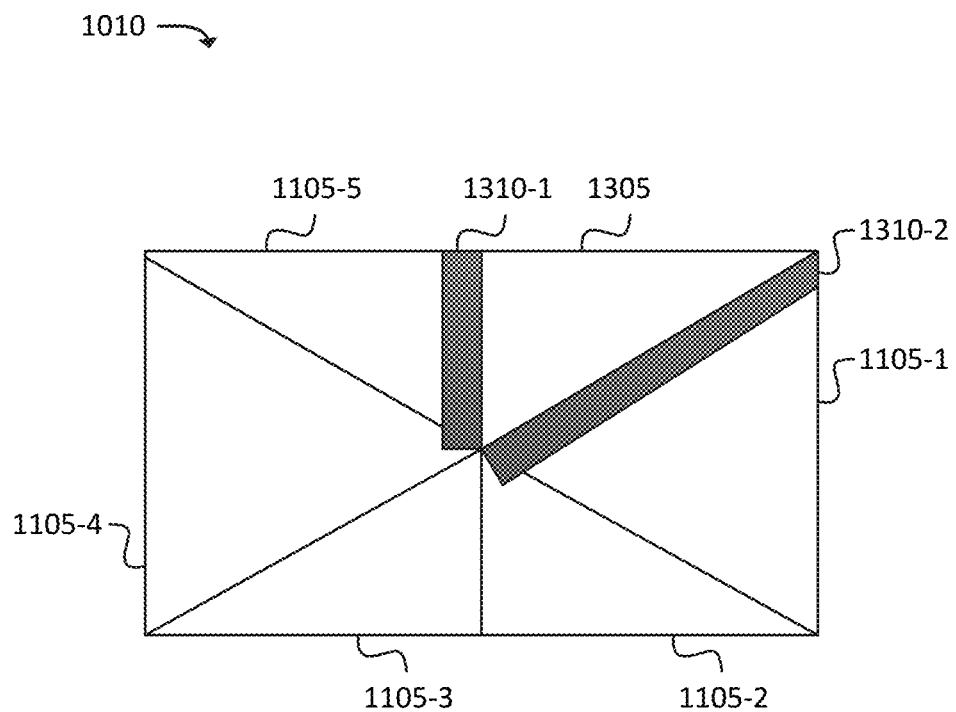
FIG. 13 illustrates a two-dimensional view of a self-actuating vent apparatus with seals, in accordance with some embodiments.

In some embodiments, a combination of actuating and non-actuating panels may be used. For example, as shown in FIG. 13, panel 1305 may be a non-moving panel (e.g., may not react to moisture). In some embodiments, panel 1305 may include seals 1310-1 and/or 1310-2. Seals 1310 may be rubber and/or some other suitable material, which may serve to form a seal (e.g., a moisture-tight seal) in between panel 1305 and panels 1105-2 and 1105-5. That is, in this example, seal 1310-1 may partially overlap panel 1105-5, and seal 1310-2 may partially overlap panel 1105-1.

While one non-moving panel 1305 is shown here, in practice, multiple non-moving panels 1305 may be used. Non-moving panels 1305 may used to add rigidity to outdoor hardware apparatus 1000 and/or to self-actuating vent apparatus 1010. In some embodiments, one or more seals 1310 may used on a self-actuating panel (e.g., one or more panels 1105). In such embodiments, the seal 1310 may be constructed from rubber and/or some other suitable flexible material that is able to curve and/or bend when an attached panel 1105 actuates (e.g., curves and/or bends).

In some embodiments, panels 1105 that are responsive to different levels of moisture may be used. In this regard, the order of the opening of panels 1105 may be controlled. For example, assume panel 1105-1 is responsive to a relatively low amount of moisture (e.g., actuates when exposed to humid air, or a few drops of liquid), while panel 1105-2 is responsive to a relatively high amount of moisture (e.g., actuates when completely drenched). Under these conditions, panel 1105-1 would generally actuate before panel 1105-2 would actuate, as panel 1105-1 has a lower threshold for actuation.

Some implementations are described herein in conjunction with thresholds. To the extent that the term "greater than" (or similar terms) is used herein to describe a relationship of a value to a threshold, it is to be understood that the term "greater than or equal to" (or similar terms) could be similarly contemplated, even if not explicitly stated. Similarly, to the extent that the term "less than" (or similar terms) is used herein to describe a relationship of a value to a threshold, it is to be understood that the term "less than or equal to" (or similar terms) could be similarly contemplated, even if not explicitly stated. Further, the term "satisfying," when used in relation to a threshold, may refer to "being greater than a threshold," "being greater than or equal to a threshold," "being less than a threshold," "being less than or equal to a threshold," or other similar terms, depending on the appropriate context.

To the extent the aforementioned implementations collect, store, or employ personal information provided by individuals, it should be understood that such information shall be collected, stored, and used in accordance with all applicable laws concerning protection of personal information. Additionally, the collection, storage, and use of such information may be subject to consent of the individual to such activity (for example, through "opt-in" or "opt-out" processes, as may be appropriate for the situation and type of information). Storage and use of personal information may be in an appropriately secure manner reflective of the type of information, for example, through various encryption and anonymization techniques for particularly sensitive information.

No element, act, or instruction used in the present application should be construed as critical or essential unless explicitly described as such. An instance of the use of the term "and," as used herein, does not necessarily preclude the interpretation that the phrase "and/or" was intended in that instance. Similarly, an instance of the use of the term "or," as used herein, does not necessarily preclude the interpretation that the phrase "and/or" was intended in that instance. Also, as used herein, the article "a" is intended to include one or more items, and may be used interchangeably with the phrase "one or more." Where only one item is intended, the terms "one," "single," "only," or similar language is used. Further, the phrase "based on" is not necessarily intended to mean "based exclusively on," unless explicitly stated otherwise. For example, the phrase "based on" may mean "based, at least in part, on" when such an interpretation would be reasonable, and when not explicitly stated otherwise.

What is claimed is:

1. An apparatus, comprising:
a flap;
an actuation apparatus, at least partially coupled to the flap, that is capable of actuating the flap from an open position to a closed position, with respect to a particular surface, wherein the actuation apparatus includes:
a self-actuating material responsive to heat, wherein the self-actuating material is capable of maintaining a first shape state or a different second shape state based on how much heat is applied to the self-actuating material,
wherein the first state shape causes the flap, affixed to the actuation apparatus, to be closed with respect to the particular surface, and
wherein the second state shape causes the flap, affixed to the actuation apparatus, to be open with respect to the particular surface; and
one or more actuator arms that do not include the self-actuating material that is responsive to heat,
wherein the one or more actuator arms include at least a first actuator arm and a second actuator arm separated by, and coupled to, a hinge that includes the self-actuating material.

2. The apparatus of claim 1, wherein a face of the flap, when the flap is in the closed position, is substantially parallel to the one or more actuator arms.

3. The apparatus of claim 2, wherein the face of the flap, when the flap is in the open position, is not parallel to the one or more actuator arms.

4. An apparatus, comprising:
a flap; and
an actuation apparatus, at least partially coupled to the flap, that is capable of actuating the flap from an open position to a closed position, with respect to a particular surface, wherein the actuation apparatus includes:
a self-actuating material responsive to heat, wherein the self-actuating material is capable of maintaining a first shape state or a different second shape state based on how much heat is applied to the self-actuating material,
wherein the first state shape causes the flap, affixed to the actuation apparatus, to be closed with respect to the particular surface,
wherein the second state shape causes the flap, affixed to the actuation apparatus, to be open with respect to the particular surface, and
wherein the flap includes one or more troughs, wherein when the one or more troughs hold an amount of material that exceeds a threshold weight, the flap is unable to open, independent of how much heat is applied to the self-actuating material.

5. The apparatus of claim 4, further comprising a hinge affixed to:
the actuation apparatus, and
the flap.

6. An apparatus, comprising:
one or more vent holes; and
a venting apparatus situated proximate to a particular vent hole, of the one or more vent holes, wherein the venting apparatus includes:
a flap;
an actuation apparatus, at least partially coupled to the flap, that is capable of actuating the flap from an open position to a closed position, with respect to the particular vent hole, wherein the actuation apparatus includes:
a self-actuating material responsive to heat, wherein the self-actuating material is capable of maintaining a first shape state or a different second shape state based on how much heat is applied to the self-actuating material,
wherein the first state shape causes the flap, affixed to the actuation apparatus, to be closed with respect to the particular vent hole,
wherein the second state shape causes the flap, affixed to the actuation apparatus, to be open with respect to the particular vent hole,
wherein the actuating apparatus further includes one or more actuator arms that do not include the self-actuating material that is responsive to heat, and
wherein the one or more actuator arms include at least a first actuator arm and a second actuator arm separated by, and coupled to, a hinge that includes the self-actuating material.

7. An apparatus, comprising:
one or more vent holes; and
a venting apparatus situated proximate to a particular vent hole, of the one or more vent holes, wherein the venting apparatus includes:
a flap;
an actuation apparatus, at least partially coupled to the flap, that is capable of actuating the flap from an open position to a closed position, with respect to the particular vent hole, wherein the actuation apparatus includes:
a self-actuating material responsive to heat, wherein the self-actuating material is capable of maintaining a first shape state or a different second shape state based on how much heat is applied to the self-actuating material,
wherein the first state shape causes the flap, affixed to the actuation apparatus, to be closed with respect to the particular vent hole,
wherein the second state shape causes the flap, affixed to the actuation apparatus, to be open with respect to the particular vent hole, and
wherein the flap includes one or more troughs, wherein when the one or more troughs hold an amount of material that exceeds a threshold weight, the flap is unable to open, independent of how much heat is applied to the self-actuating material.

8. The apparatus of claim 7, wherein the actuating apparatus further includes one or more actuator arms that do not include the self-actuating material that is responsive to heat.

9. The apparatus of claim 8, wherein a face of the flap, when the flap is in the closed position, is substantially parallel to the one or more actuator arms.

10. The apparatus of claim 8, wherein a face of the flap, when the flap is in the closed position, is substantially parallel to an opening of the particular vent hole.

11. The apparatus of claim 9, wherein the face of the flap, when the flap is in the open position, is not parallel to the one or more actuator arms.

12. The apparatus of claim 7, further comprising a hinge affixed to:
   the actuation apparatus, and
   the flap.

13. A venting apparatus, comprising:
   a hinge affixable to a particular surface;
   a flap affixed to the hinge; and
   an actuation apparatus, affixed to the hinge, that is capable of actuating the flap from an open position to a closed position, with respect to the particular surface, wherein the actuation apparatus includes:
      a self-actuating material responsive to heat, wherein the self-actuating material is capable of maintaining a first shape state or a different second shape state based on how much heat is applied to the self-actuating material,
      wherein the first state shape causes the flap, affixed to the actuation apparatus, to be closed with respect to the particular surface,
      wherein the second state shape causes the flap, affixed to the actuation apparatus, to be open with respect to the particular surface, and
      wherein the flap includes one or more troughs, wherein when the one or more troughs hold an amount of material that exceeds a threshold weight, the flap is unable to open, independent of how much heat is applied to the self-actuating material.

14. The venting apparatus of claim 13, wherein the actuating apparatus further includes one or more actuator arms that do not include the self-actuating material that is responsive to heat.

15. The venting apparatus of claim 14, wherein a face of the flap, when the flap is in the closed position, is substantially parallel to the one or more actuator arms.

16. The venting apparatus of claim 14, wherein the face of the flap, when the flap is in the open position, is not parallel to the one or more actuator arms.

17. A venting apparatus, comprising:
   a hinge affixable to a particular surface;
   a flap affixed to the hinge;
   an actuation apparatus, affixed to the hinge, that is capable of actuating the flap from an open position to a closed position, with respect to the particular surface, wherein the actuation apparatus includes:
      a self-actuating material responsive to heat, wherein the self-actuating material is capable of maintaining a first shape state or a different second shape state based on how much heat is applied to the self-actuating material,
      wherein the first state shape causes the flap, affixed to the actuation apparatus, to be closed with respect to the particular surface, and
      wherein the second state shape causes the flap, affixed to the actuation apparatus, to be open with respect to the particular surface; and
   one or more actuator arms that do not include the self-actuating material that is responsive to heat,
      wherein the one or more actuator arms include at least a first actuator arm and a second actuator arm separated by, and coupled to, a hinge that includes the self-actuating material.

18. The venting apparatus of claim 17, wherein a face of the flap, when the flap is in the closed position, is substantially parallel to the one or more actuator arms.

19. The venting apparatus of claim 17, wherein a face of the flap, when the flap is in the open position, is not parallel to the one or more actuator arms.

20. The venting apparatus of claim 17, wherein the flap includes one or more troughs.

* * * * *